(12) United States Patent
Majumder et al.

(10) Patent No.: US 8,513,992 B1
(45) Date of Patent: Aug. 20, 2013

(54) METHOD AND APPARATUS FOR IMPLEMENTATION OF PLL MINIMUM FREQUENCY VIA VOLTAGE COMPARISON

(75) Inventors: Amit Majumder, Duluth, GA (US); Praveen Rajan Singh, Duluth, GA (US); Alejandro Flavio Gonzalez, Alpharetta, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 76 days.

(21) Appl. No.: 12/879,995

(22) Filed: Sep. 10, 2010

(51) Int. Cl.
*H03L 7/06* (2006.01)

(52) U.S. Cl.
USPC .......................... 327/157; 327/148

(58) Field of Classification Search
USPC ................................. 327/148, 157
See application file for complete search history.

(56) References Cited

U.S. PATENT DOCUMENTS

| | | | | |
|---|---|---|---|---|
| 6,774,732 B1* | 8/2004 | Harnishfeger et al. | ......... | 331/25 |
| 7,099,643 B2* | 8/2006 | Lin | ............................. | 455/255 |
| 7,504,893 B2* | 3/2009 | Gonzalez et al. | ............... | 331/17 |
| 7,504,894 B2* | 3/2009 | Kawamoto et al. | ............. | 331/44 |
| 7,737,792 B2* | 6/2010 | Kawamoto et al. | ............. | 331/10 |
| 7,764,129 B1* | 7/2010 | Wong et al. | ..................... | 331/44 |
| 7,969,248 B1* | 6/2011 | Whitten et al. | .................. | 331/16 |
| 8,134,392 B2* | 3/2012 | Kawamoto | ..................... | 327/156 |
| 8,134,393 B1* | 3/2012 | Nagaraj et al. | ................ | 327/156 |
| 8,143,957 B2* | 3/2012 | Quan et al. | ...................... | 331/16 |
| 2003/0203720 A1* | 10/2003 | Oosawa et al. | ................. | 455/84 |
| 2006/0145776 A1* | 7/2006 | Shi et al. | ....................... | 331/175 |
| 2007/0030079 A1* | 2/2007 | Kawamoto et al. | ............. | 331/16 |
| 2007/0159262 A1* | 7/2007 | Quan et al. | ...................... | 331/16 |
| 2007/0164829 A1* | 7/2007 | Ko | .................................. | 331/17 |
| 2007/0280397 A1* | 12/2007 | Ikeda et al. | ..................... | 375/374 |
| 2008/0007345 A1* | 1/2008 | Cranford et al. | ................. | 331/16 |
| 2008/0129388 A1* | 6/2008 | Gonzalez et al. | ............... | 331/10 |
| 2008/0191758 A1* | 8/2008 | Dykstra | ....................... | 327/157 |
| 2008/0231346 A1* | 9/2008 | Hung | ............................ | 327/536 |
| 2009/0153204 A1* | 6/2009 | Kawamoto et al. | ........... | 327/157 |
| 2010/0134163 A1* | 6/2010 | Kawamoto | ..................... | 327/157 |
| 2010/0271141 A1* | 10/2010 | Hirai | ............................... | 331/34 |
| 2011/0057695 A1* | 3/2011 | Lee | ................................ | 327/157 |
| 2011/0057696 A1* | 3/2011 | Hsieh et al. | ..................... | 327/157 |
| 2011/0181326 A1* | 7/2011 | Sanchez et al. | ................ | 327/148 |
| 2011/0227615 A1* | 9/2011 | Faison | ........................... | 327/157 |
| 2011/0234275 A1* | 9/2011 | Sato | .............................. | 327/157 |
| 2011/0260763 A1* | 10/2011 | Wang | ............................ | 327/157 |
| 2011/0304366 A1* | 12/2011 | Kanda et al. | ................... | 327/157 |

* cited by examiner

*Primary Examiner* — Adam Houston
(74) *Attorney, Agent, or Firm* — Heimlich Law, PC; Alan Heimlich, Esq.

(57) ABSTRACT

A method and apparatus for implementation of PLL minimum frequency via voltage comparison have been described.

5 Claims, 7 Drawing Sheets

1. A method comprising selecting a control voltage based on a comparison of said control voltage and a reference voltage.
701

2. The method of claim 1 wherein said selecting said control voltage is a voltage selected from the group consisting of a phase locked loop (PLL) charge pump output control voltage, and a preset control voltage.
702

3. The method of claim 1 wherein said selecting comprises controlling one or more transmission gates.
703

4. A method comprising:
determining if a PLL output frequency is less than a predetermined minimum; and
when less than said predetermined minimum selecting a predetermined control voltage;
when not less than said predetermined minimum selecting a control voltage from a charge pump in said PLL.
704

5. The method of claim 4 wherein said determining is based on a comparison of said control voltage from said charge pump in said PLL with a reference voltage.
705

6. The method of claim 4 wherein said determining is based on said PLL output frequency.
706

7. An apparatus comprising:
 a charge pump having an output;
 a selector having a first input, a second input, a select input, and an output, wherein said charge pump output is coupled to said selector first input;
 a comparator having a first input, a second input, and an output, wherein said first input is coupled to said charge pump output, and said comparator output is coupled to said selector select input;
 a first reference voltage, said first reference voltage coupled to said comparator second input;
 a second reference voltage, said second reference voltage coupled to said selector second input; and
 a bias generator having a input, said input coupled to said selector output.
707

8. The apparatus of claim 7 wherein said selector further comprises two or more transmission gates wherein each of said two or more transmission gates has an input, an output, and a control input.
708

9. The apparatus of claim 8 wherein at least one of said two or more transmission gates has its input coupled to said charge pump output and its output coupled to said bias generator input.
709

10. The apparatus of claim 9 wherein at least one of said two or more transmission gates has its input coupled to said second reference voltage and its output coupled to said bias generator input.
710

METHOD AND APPARATUS FOR IMPLEMENTATION OF PLL MINIMUM FREQUENCY VIA VOLTAGE COMPARISON

FIELD OF THE INVENTION

The present invention pertains to phase lock loop (PLL) type circuits. More particularly, the present invention relates to a method and apparatus for implementation of PLL minimum frequency via voltage comparison.

BACKGROUND OF THE INVENTION

Phase lock loop (PLL) type circuits "lock" on an incoming reference frequency signal and track it within the range of the PLL. If the incoming reference frequency is too low then the PLL may not be able to "lock" to the signal or if "locked" may lose "lock" if the signal frequency goes too low. Under these conditions of lost lock the output of the PLL, which is often derived from a voltage controlled oscillator (VCO) may not be stable. This presents a problem. Thus there is a great need for this technical problem to be solved by maintaining a minimum VCO frequency such that when the input signal frequency is in range to be locked that the PLL exists gracefully from the minimum VCO frequency and can resume normal operation in a closed-loop fashion.

BRIEF DESCRIPTION OF THE DRAWINGS

The invention is illustrated by way of example and not limitation in the figures of the accompanying drawings in which:

FIG. 6 illustrates one embodiment of the invention showing a flow chart; and.

DETAILED DESCRIPTION

In one embodiment of the invention implementing a PLL minimum frequency (Fmin) involves comparing a PLL control voltage $V_{CTRL}$ with a reference voltage (Vmin) to determine when the Fmin condition is reached.

In one embodiment of the invention a selector (e.g. switch, multiplexor, etc.) is placed between the bias generator in the PLL and a controlling voltage which may be the PLL control voltage $V_{CTRL}$ or a minimum control voltage established to keep the PLL VCO output at a Fmin condition.

In one embodiment of the invention the selector is a multiplexor (also denoted a multiplexer).

In one embodiment of the invention the selector is made up of one or more transmission gates.

In one embodiment of the invention the selector gradually switches from one input to the other in an analog fashion.

In one embodiment of the invention the selector switches quickly from one input to the other in a digital fashion.

Figure 3:
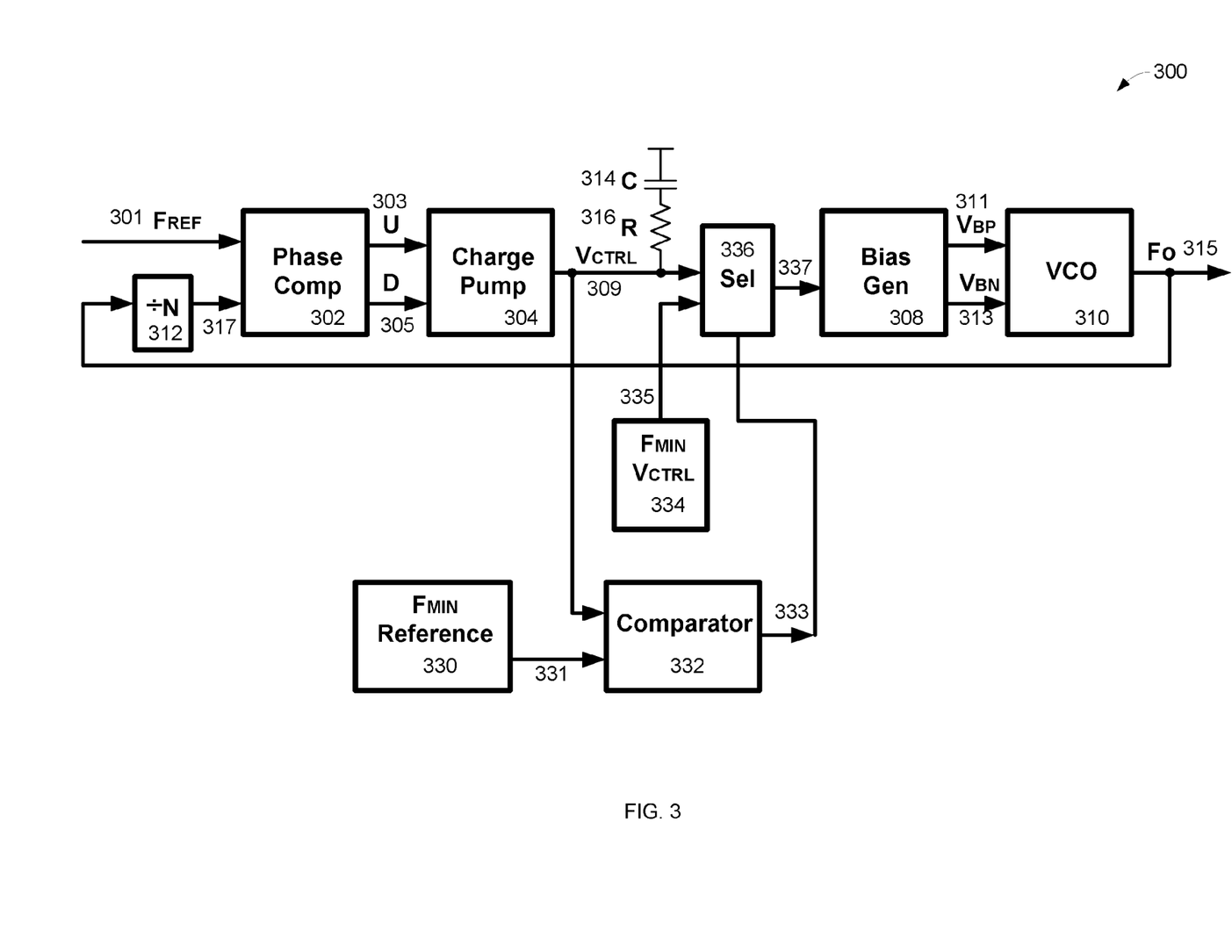
FIG. 3 illustrates one embodiment of the invention showing a block diagram.

FIG. 3 illustrates, generally at 300, one embodiment of the invention showing a block diagram. At 301 is a reference frequency $F_{REF}$ which goes into a phase comparator Phase Comp 302. Phase Comp 302 has outputs up U at 303, and down D at 305. Inputs U 303 and D 305 are input to a charge pump Charge Pump 304. The output of Charge Pump 304 is a control voltage $V_{CTRL}$ 309 which is filtered by a low pass filter composed of a resistor R 316 and a capacitor C 314. $V_{CTRL}$ 309 goes to one input on a selector Sel 336. $V_{CTRL}$ 309 goes to one input on comparator Comparator 332. A frequency minimum reference block FMIN Reference 330 outputs a signal 331 which goes into Comparator 332. Comparator 332 generates an output signal 333 which goes into selector Sel 336 and controls which input is selected to go to the bias generator Bias Gen 308 via selector Sel 336 output signal 337. The bias generator Bias Gen 308 has outputs voltage bias $V_{BP}$ 311 and voltage bias $V_{BN}$ 313 which both go to a voltage controlled oscillator VCO 310. VCO 310 has a frequency output Fo 315 which goes to a divider N 312 who's output 317 is an input into Phase Comp 302.

In one embodiment of the invention, for example, as shown in FIG. 3 shows a block diagram of a self-biased PLL, generally at 300. Output frequency Fo 315 is proportional to $F_{REF}$ 301. If $F_{REF}$ 301 is reduced arbitrarily, Fo 315 can be too low to be sustained by the VCO 310. In such cases, it is often desirable to hold Fo 315 to some predetermined minimum frequency Fmin in an open-loop fashion. A condition for this Fmin state is that when $F_{REF}$ 301 is brought back up to higher frequency levels, then the PLL should gracefully exit the Fmin state and begin normal operation in closed-loop fashion.

Figure 4:
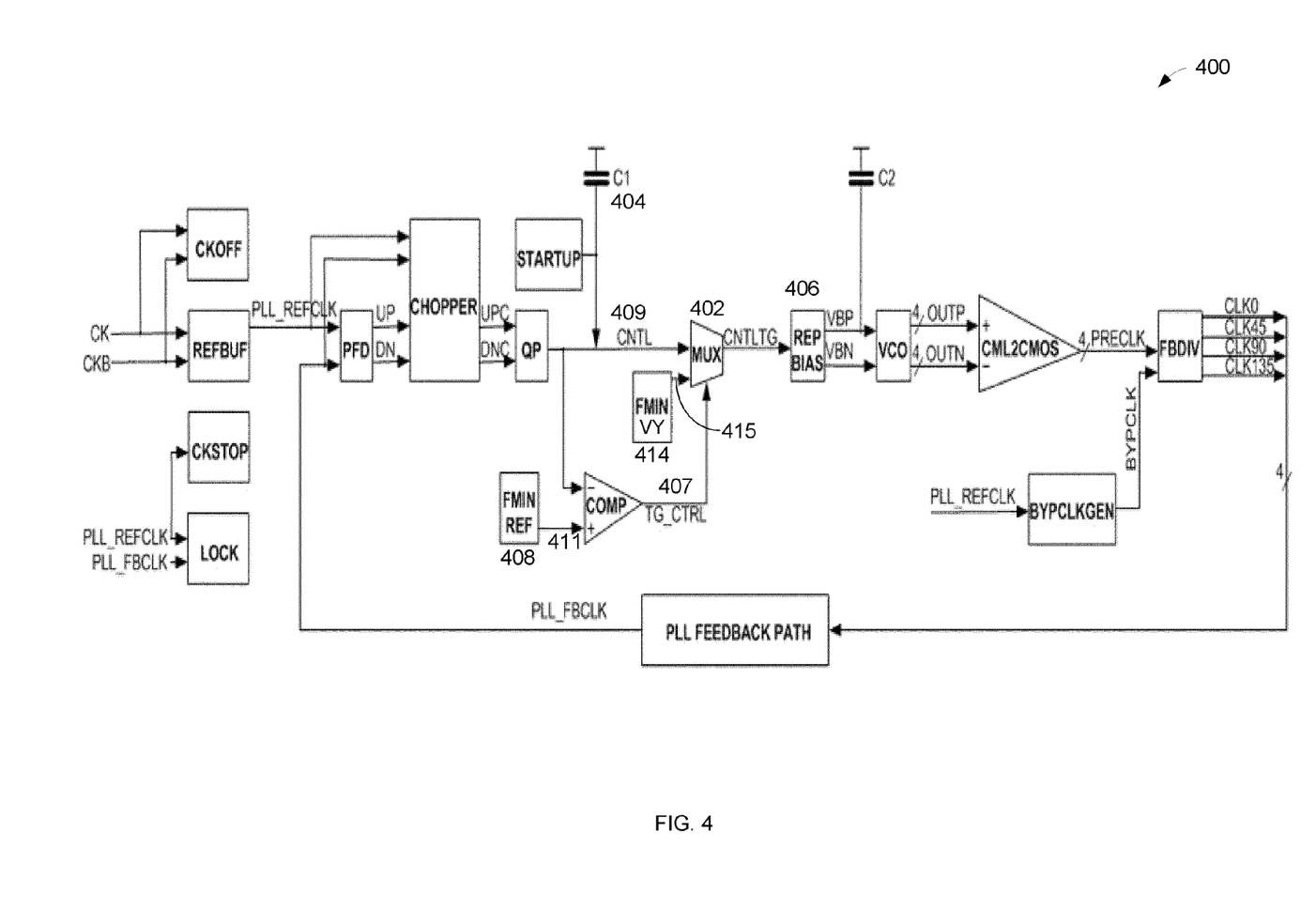
FIG. 4 illustrates one embodiment of the invention showing a block diagram.

In one embodiment of the invention, for example, as shown in FIG. 4 one approach inserts a transmission gate mux (MUX) 402 after the loop filter 404 and before the Bias Generator circuits REP BIAS 406. This mux 402 is controlled by the decision TG_CTRL 407 made via comparing $V_{CTRL}$ CNTL 409 with the bias voltage Vmin 411 generated by block FMIN REF 408. This bias voltage 411 corresponds to frequency out Fo=frequency minimum Fmin. Fmin state is entered when reference clock frequency is brought down too low and $V_{CTRL}$ represents Fo<Fmin. At this state PLL operates in open-loop fashion. The charge pumps are kept active during the Fmin state to ensure that the design has capability to gracefully exit the Fmin state and begin normal operation in closed-loop fashion when and if reference clock frequency is brought back up to levels that dictate Fo>Fmin.

In one embodiment of the invention, for example, as shown in FIG. 4, the frequency minimum reference voltage 411 from FMIN REF 408 may be substantially the same voltage as at the input 415 to a multiplexor 402 from FMIN VY 414.

In one embodiment of the invention, for example, as shown in FIG. 4, the voltage at the input 415 to a multiplexor 402 from FMIN VY 414 may be different than the frequency minimum reference voltage 411 from FMIN REF 408. This may account for losses and/or different circuit configurations.

What is to be appreciated is that by selecting a proper input at the selector, multiplexor, or switch Fo may be maintained at a minimum predetermined frequency.

Figure 5:
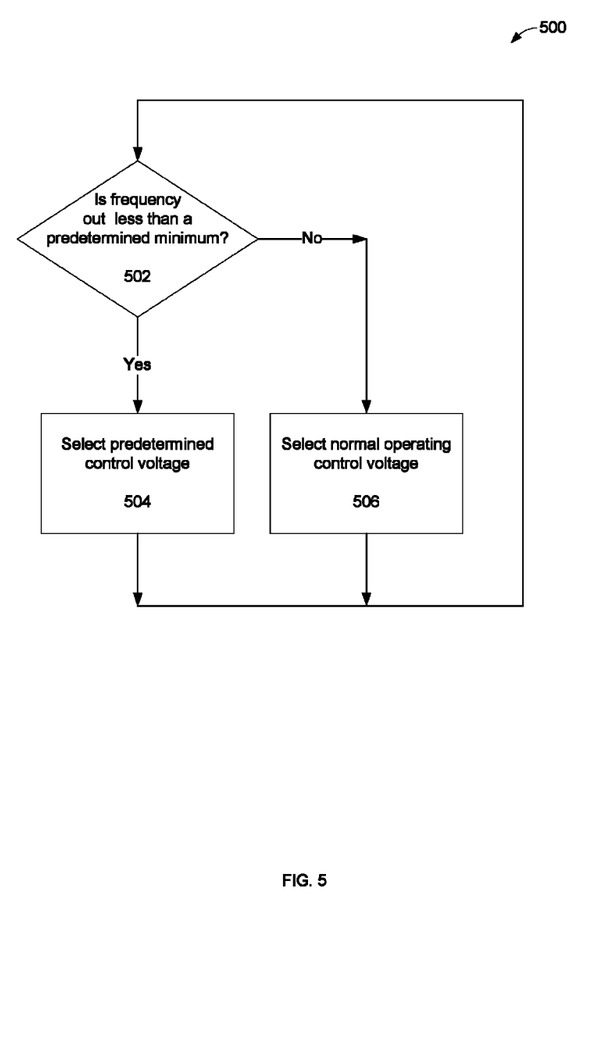
FIG. 5 illustrates one embodiment of the invention showing a flow chart.

FIG. 5 illustrates, generally at 500, one embodiment of the invention showing a flow chart. At 502 a check is made to see if the frequency out is less than a predetermined minimum and if so then at 504 a predetermined control voltage is selected and another check is made at 502. At 502 a check is made to see if the frequency out is less than a predetermined minimum and if not then at 506 the normal operating control voltage is selected and another check is made at 502.

Figure 6:
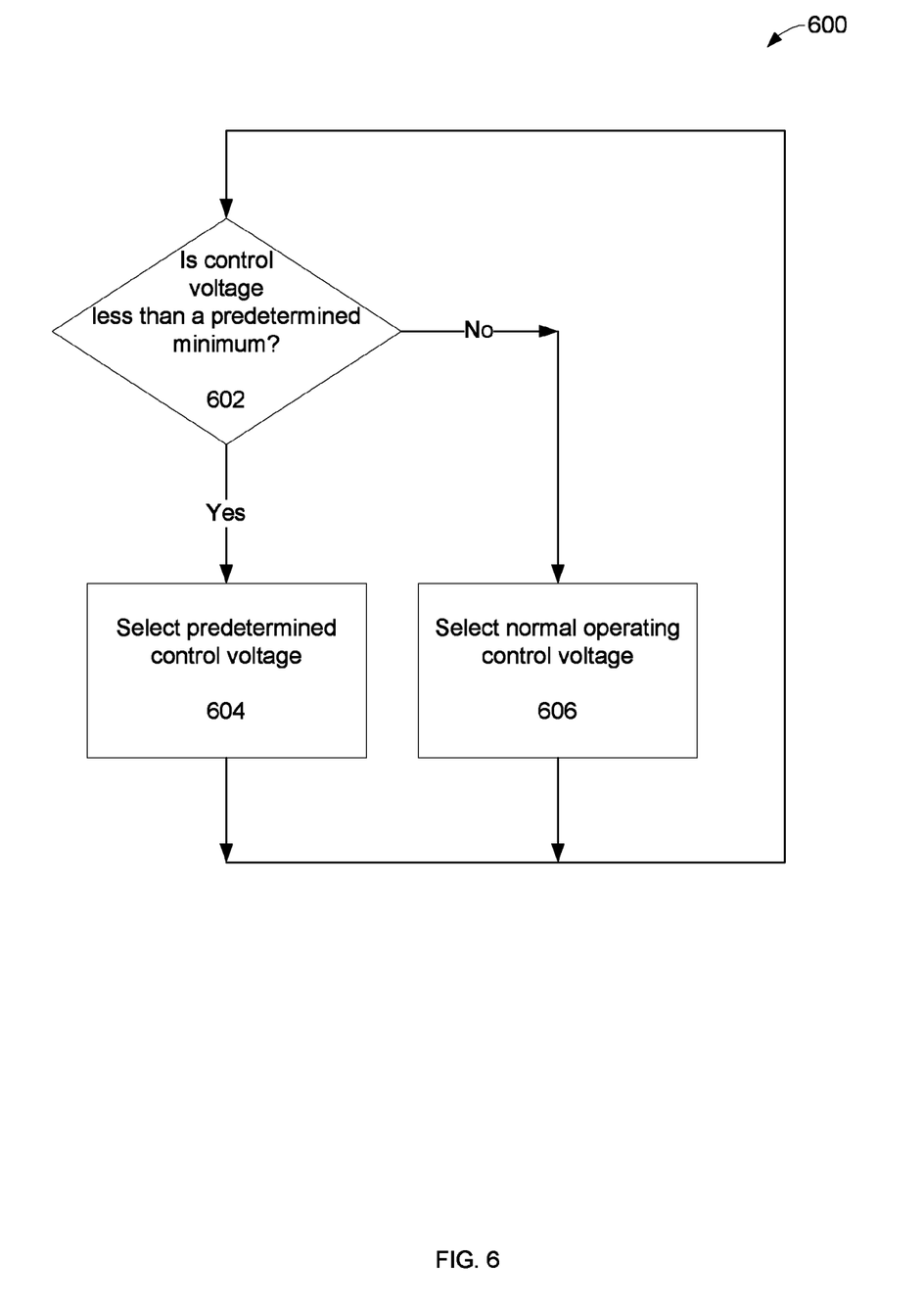

FIG. 6 illustrates, generally at 600, one embodiment of the invention showing a flow chart. At 602 a check is made to see if the control voltage is less than a predetermined minimum and if so then at 604 a predetermined control voltage is selected and another check is made at 602. At 602 a check is made to see if the control voltage is less than a predetermined minimum and if not then at 606 the normal operating control voltage is selected and another check is made at 602.

Note that FIG. 6 has been illustrated assuming that a control voltage (e.g. Vctrl) relates directly to an output frequency (e.g. Fo), that is as the control voltage increases the output frequency increases. However, the invention is not so limited and in the case where the control voltage relates inversely to the frequency (i.e. as the control voltage goes up the output frequency goes down), then a check for a predetermined maximum control voltage would control whether a normal operating control voltage would be used or a predetermined control voltage. Regardless of the implementation being a direct or inverse relationship of a control voltage to output frequency, what is to be appreciated is that by checking the control voltage against some predetermined level either a normal operating control voltage or a predetermined control voltage may be selected.

While embodiments of the invention have been illustrated with respect to maintaining a minimum output frequency by examining the control voltage, one of skill in the art will appreciate that determining the output frequency by examining the output frequency is possible and this can be used to decide which control voltage (normal operating, or preset voltage) to use. For example, measuring a minimum output frequency may be performed with an RC type network and a voltage comparator. What is to be appreciated is that by selecting either the normal operating control voltage or a preset control voltage a minimum frequency for the VCO in a PLL may be maintained.

Figure 7:
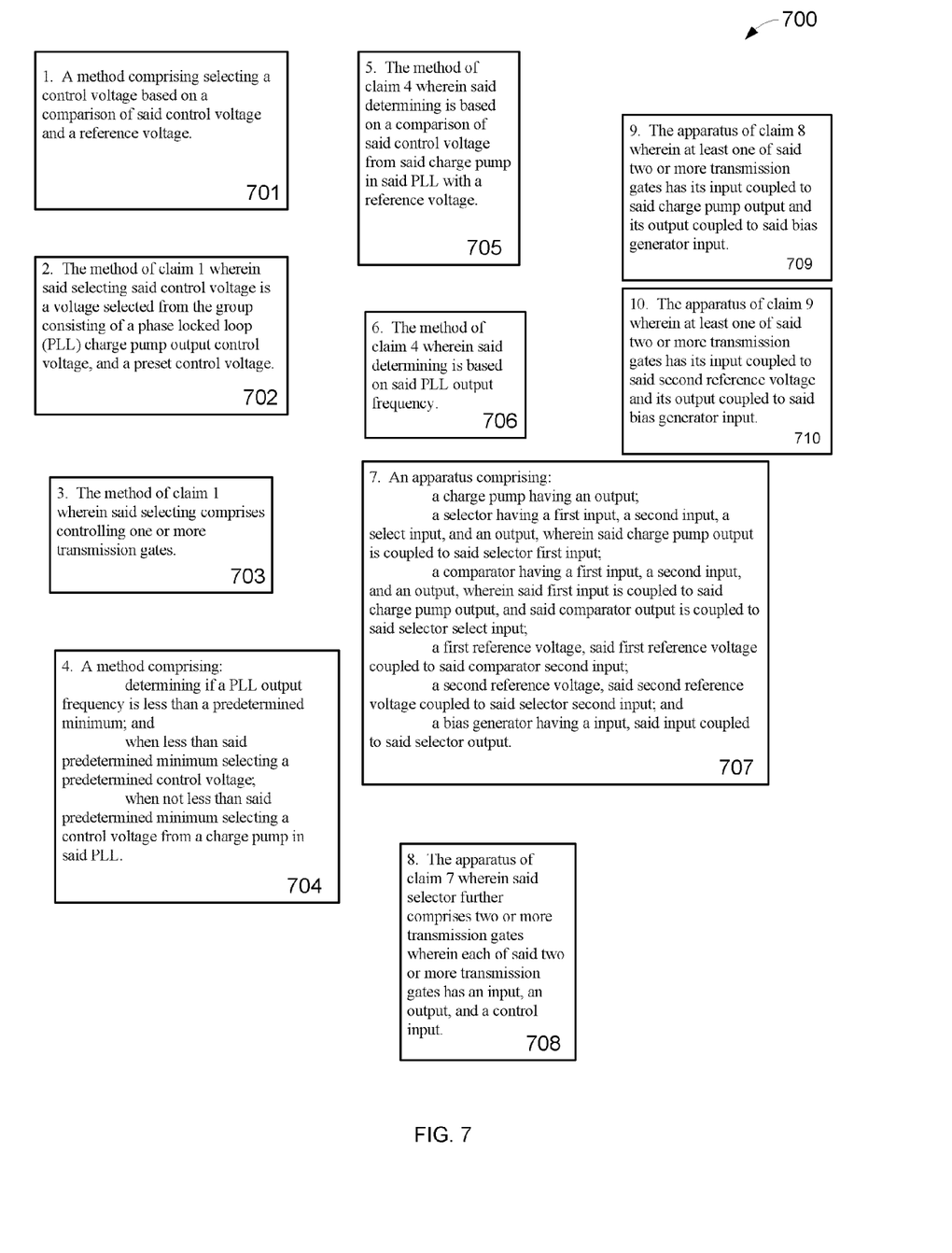
FIG. 7 illustrates embodiments of the invention.

FIG. 7 illustrates, generally at 700, embodiments of the invention.

At 701 is 1. A method comprising selecting a control voltage based on a comparison of said control voltage and a reference voltage.

At 702 is 2. The method of claim 1 wherein said selecting said control voltage is a voltage selected from the group consisting of a phase locked loop (PLL) charge pump output control voltage, and a preset control voltage.

At 703 is 3. The method of claim 1 wherein said selecting comprises controlling one or more transmission gates.

At 704 is 4. A method comprising:
determining if a PLL output frequency is less than a predetermined minimum; and
when less than said predetermined minimum selecting a predetermined control voltage;
when not less than said predetermined minimum selecting a control voltage from a charge pump in said PLL.

At 705 is 5. The method of claim 4 wherein said determining is based on a comparison of said control voltage from said charge pump in said PLL with a reference voltage.

At 706 is 6. The method of claim 4 wherein said determining is based on said PLL output frequency.

At 707 is 7. An apparatus comprising:
a charge pump having an output;
a selector having a first input, a second input, a select input, and an output, wherein said charge pump output is coupled to said selector first input;
a comparator having a first input, a second input, and an output, wherein said first input is coupled to said charge pump output, and said comparator output is coupled to said selector select input;
a first reference voltage, said first reference voltage coupled to said comparator second input;
a second reference voltage, said second reference voltage coupled to said selector second input; and
a bias generator having a input, said input coupled to said selector output.

At 708 is 8. The apparatus of claim 7 wherein said selector further comprises two or more transmission gates wherein each of said two or more transmission gates has an input, an output, and a control input.

At 709 is 9. The apparatus of claim 8 wherein at least one of said two or more transmission gates has its input coupled to said charge pump output and its output coupled to said bias generator input.

At 710 is 10. The apparatus of claim 9 wherein at least one of said two or more transmission gates has its input coupled to said second reference voltage and its output coupled to said bias generator input.

Thus a method and apparatus for implementation of PLL minimum frequency via voltage comparison have been described.

Figure 1:
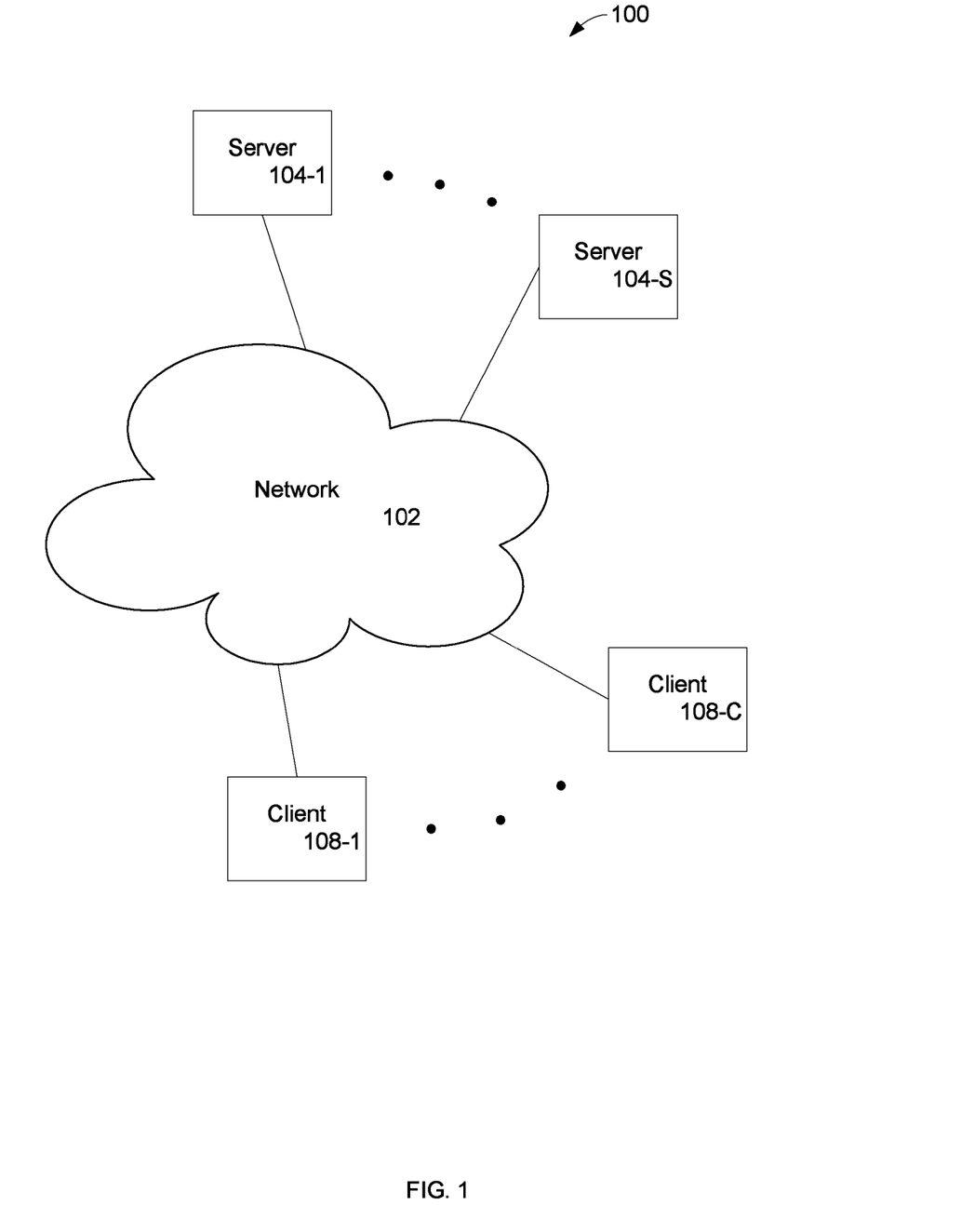
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
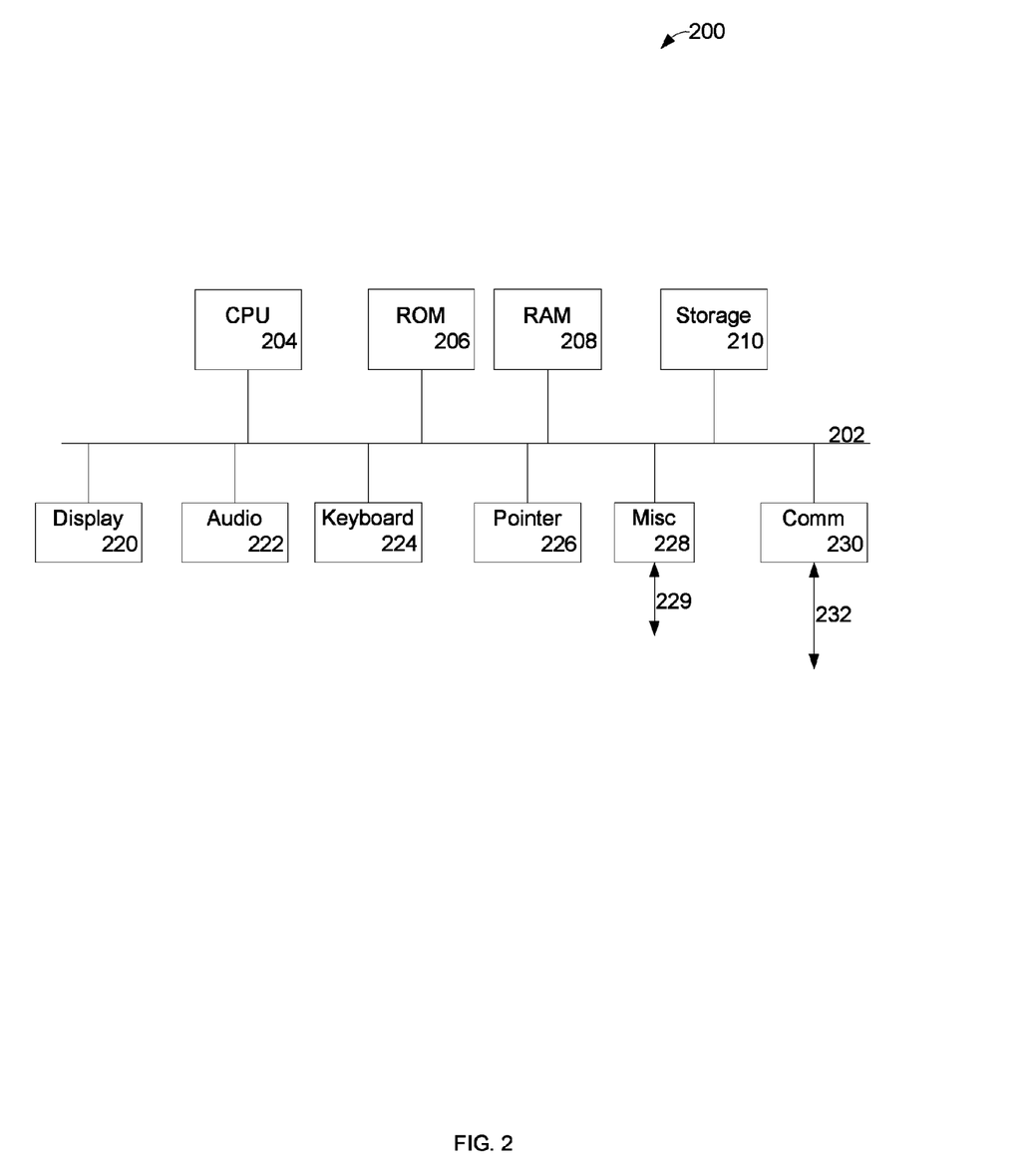
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228 via link 229, and communications 230 via link 232. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals which upon reception causes movement in matter (e.g. electrons, atoms, etc.) (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as ""substantially equal" is used to indicate that they are for all practical purposes equal.

It is to be understood that in any one or more embodiments of the invention where alternative approaches or techniques are discussed that any and all such combinations as my be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for implementation of PLL minimum frequency via voltage comparison have been described.

What is claimed is:

1. A method comprising
determining if a PLL output frequency is less than a predetermined minimum; and
when less than said predetermined minimum selecting a predetermined control voltage;
when not less than said predetermined minimum selecting a control voltage from a charge pump in said PLL; and
wherein said determining is based on a comparison of said control voltage from said charge pump in said PLL with a reference voltage.

2. An apparatus comprising:
a charge pump having an output;
a selector having a first input, a second input, a select input, and an output, wherein said charge pump output is coupled to said selector first input;
a comparator having a first input, a second input, and an output, wherein said first input is coupled to said charge pump output, and said comparator output is coupled to said selector select input;
a first reference voltage, said first reference voltage coupled to said comparator second input;
a second reference voltage, said second reference voltage coupled to said selector second input; and
a bias generator having a input, said input coupled to said selector output.

3. The apparatus of claim 2 wherein said selector further comprises two or more transmission gates wherein each of said two or more transmission gates has an input, an output, and a control input.

4. The apparatus of claim 3 wherein at least one of said two or more transmission gates has its input coupled to said charge pump output and its output coupled to said bias generator input.

5. The apparatus of claim 4 wherein at least one of said two or more transmission gates has its input coupled to said second reference voltage and its output coupled to said bias generator input.

* * * * *